United States Patent
Budiman et al.

(10) Patent No.: US 9,965,181 B2
(45) Date of Patent: May 8, 2018

(54) HYBRID-HDD WITH MULTIPLE CACHING MODES

(71) Applicant: KABUSHIKI KAISHA TOSHIBA, Tokyo (JP)

(72) Inventors: Mine Wonkyung Budiman, Livermore, CA (US); Andre C. Hall, Fremont, CA (US); Eric R. Dunn, Cupertino, CA (US); Thorsten Schmidt, Livermore, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 420 days.

(21) Appl. No.: 14/681,392

(22) Filed: Apr. 8, 2015

(65) Prior Publication Data

US 2016/0299850 A1 Oct. 13, 2016

(51) Int. Cl.
| | |
|---|---|
| G06F 12/00 | (2006.01) |
| G06F 3/06 | (2006.01) |
| G06F 12/06 | (2006.01) |
| G06F 13/16 | (2006.01) |
| G11C 16/00 | (2006.01) |
| G11C 11/00 | (2006.01) |

(52) U.S. Cl.
CPC .......... *G06F 3/06* (2013.01); *G06F 12/0638* (2013.01); *G06F 13/16* (2013.01); *G11C 11/005* (2013.01); *G11C 16/00* (2013.01)

(58) Field of Classification Search
CPC ........ G06F 3/06; G06F 12/0638; G06F 13/16; G06F 16/00
See application file for complete search history.

(56) References Cited

U.S. PATENT DOCUMENTS

| | | | |
|---|---|---|---|
| 7,930,467 B2 | 4/2011 | Nam et al. | |
| 8,032,698 B2 | 10/2011 | Nam | |
| 9,104,580 B1* | 8/2015 | Meir | G06F 12/0871 |
| 9,612,953 B1* | 4/2017 | Davis | G06F 12/0238 |
| 2007/0016725 A1* | 1/2007 | Chu | G06F 3/0616 |
| | | | 711/113 |
| 2007/0162693 A1 | 7/2007 | Nam | |
| 2009/0319825 A1* | 12/2009 | Yang | G11C 16/3404 |
| | | | 714/5.1 |
| 2010/0174852 A1* | 7/2010 | Chien | G06F 12/0246 |
| | | | 711/103 |
| 2013/0218892 A1* | 8/2013 | Bell, Jr. | G06F 3/0611 |
| | | | 707/736 |

* cited by examiner

Primary Examiner — Gurtej Bansal
(74) Attorney, Agent, or Firm — Patterson & Sheridan, LLP

(57) ABSTRACT

Data is stored in a hybrid HDD that includes a magnetic storage medium and a nonvolatile solid-state device according to multiple modes of operation: a full caching mode, a transitional caching mode, and an HDD only mode. The mode of operation may be selected based on the current condition or performance of individual storage regions in a nonvolatile solid-state device of the hybrid HDD, or on the current condition or performance of the nonvolatile solid-state device as a whole. As the nonvolatile solid-state device undergoes wear, performance of the hybrid HDD is maintained by using less reliable memory blocks in the nonvolatile solid-state device as a read cache, even when these memory blocks are considered too unreliable to store dirty data.

13 Claims, 8 Drawing Sheets

HYBRID-HDD WITH MULTIPLE CACHING MODES

BACKGROUND

Hybrid hard disk drive (HDD) as one of storage devices include one or more rotating magnetic disks combined with nonvolatile solid-state (e.g., flash) memory. Generally, a hybrid HDD has both the capacity of a conventional HDD and the ability to access data as quickly as a solid-state drive, and for this reason hybrid HDDs are expected to be commonly used in laptop computers.

However, a drawback of the NAND-based memory cells in solid-state drives and hybrid HDDs is that such memory cells are only operable for a limited number of program/erase cycles. Furthermore, at higher temperatures, data retention of NAND memory cells is greatly reduced. For example, when single-level cell (SLC) NAND memory cells are elevated to a temperature greater than 70 to 80° C., even short-term retention of data of these NAND cells may become unreliable, and they cannot be considered a dependable nonvolatile data storage medium. This is because data stored in NAND cells may be lost at anytime under such conditions. For a hybrid HDD that includes multi-level cell (MLC) NAND memory, reliability is even more of an issue, since MLC cell reliability may be compromised after fewer program/erase cycles and at lower temperatures than SLC cells.

Because reads from and writes to NAND memory are much faster than reads from and writes to a magnetic disk, a significant advantage of hybrid HDDs over conventional HDDs is that the NAND memory included in a hybrid HDD can be used as a large read and write cache that reduces the frequency of relatively time-consuming disk accesses. In fact, with enough NAND memory, the performance of a hybrid HDD can approach that of a solid-state drive, since disk accesses are so infrequent. But as NAND memory cells become less reliable, this improved performance is generally lost, since the NAND memory cells of the hybrid HDD can no longer be used to reliably store for an extended period of time. NAND memory cells may become less reliable through wear, or may be considered inherently unreliable if the maximum temperature at which the memory cells can reliably retain data is too low to store dirty data (that is, data for which an up-to-date copy does not exist on the Disk) in the NAND. In either case, such NAND memory cells are generally unsuitable for use as a write cache that quickly receives and stores data for subsequent writing to disk, a principle advantage of a hybrid HDD. So while hybrid HDDs can incorporate some of the advantages of solid-state drives, in certain situations these advantages may be lost.

SUMMARY

One or more embodiments provide systems and methods for storing data in a hybrid hard disk drive (HDD) that includes a magnetic storage medium and a nonvolatile solid-state device. During operation, a hybrid HDD stores data according to one of three modes of operation: (1) a full caching mode, (2) a transitional caching mode, and (3) an HDD only mode. In some embodiments, the above modes of operation are implemented based on the current condition or performance of specific regions of the nonvolatile solid-state device. In other embodiments, the above modes of operation are implemented for all or most regions of the nonvolatile solid-state device, based on an average condition or performance of the nonvolatile solid-state device.

A data storage device, according to embodiments, includes a nonvolatile solid-state device, a magnetic storage medium, and a controller. In one embodiment, the controller is configured to store data in the data storage device according to one of a first mode of operation, a second mode of operation, and a third mode of operation. The controller in the first mode of operation stores data associated with a read or write command received from a host in a particular region of the nonvolatile solid-state storage device. The controller in the second mode of operation stores data associated with a first read or write command received from the host in the particular region when the data are stored in the magnetic storage device, and does not store data associated with a second read or write command received from the host in the particular region when the data are not stored in the magnetic storage device. The controller in the third mode of operation stores no data associated with a read or write command received from the host in the particular region.

A method of storing data, according to an embodiment, is carried out in a data storage device that includes a nonvolatile solid-state device and a magnetic storage medium. The method includes storing data in the data storage device according to one of a first mode of operation, a second mode of operation, and a third mode of operation. In the first mode of operation, data associated with a read or write command received from a host are stored in a particular region of the nonvolatile solid-state storage device. In the second mode of operation, data associated with a first read or write command received from the host are stored in the particular region when the data are stored in the magnetic storage device, but data associated with a second read or write command received from the host are not stored in the particular region when the data are not stored in the magnetic storage device. In the third mode of operation, no data associated with a read or write command received from the host are stored in the particular region.

BRIEF DESCRIPTION OF THE DRAWINGS

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
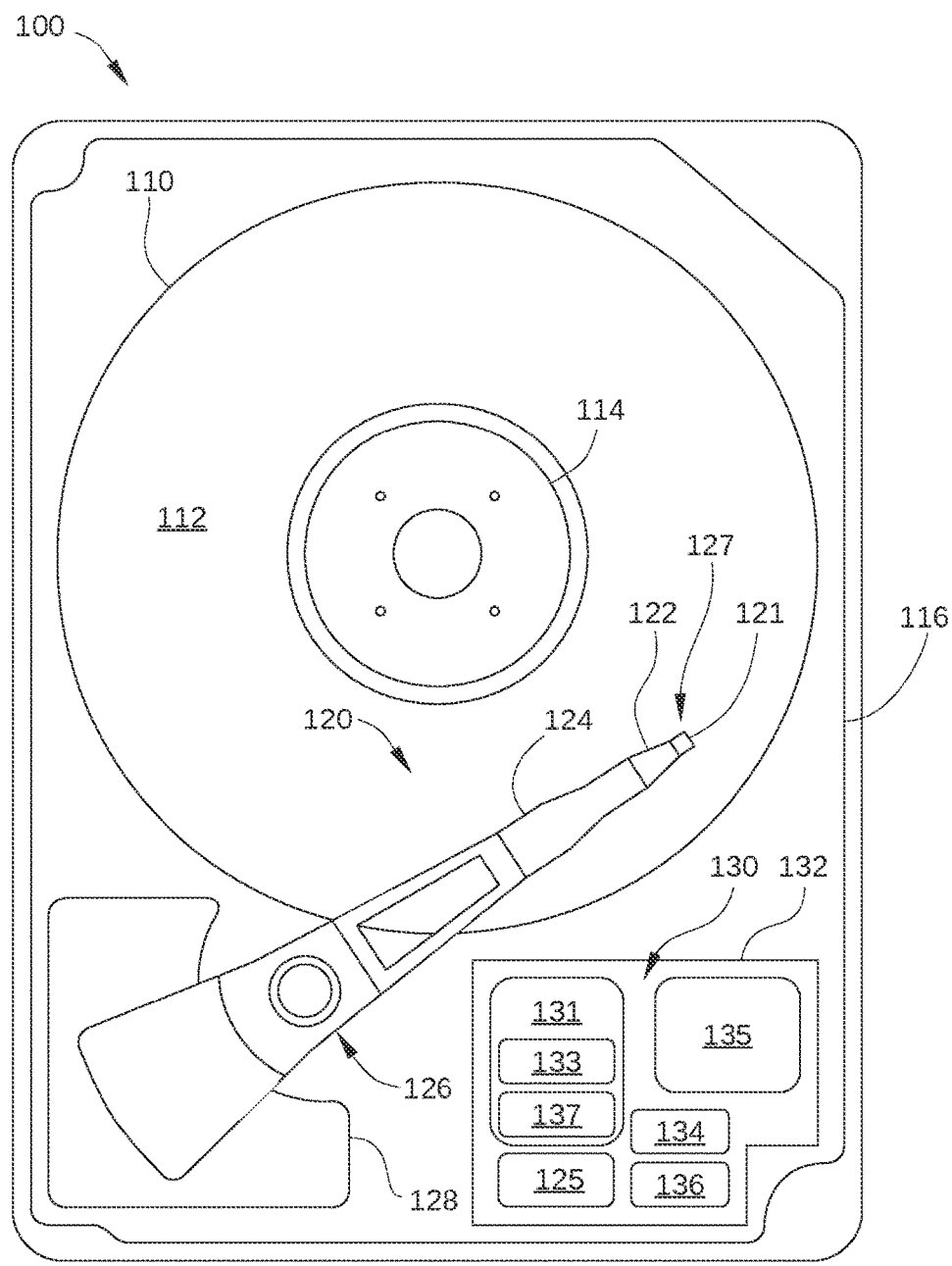
FIG. 1 is a schematic view of an exemplary hybrid hard disk drive (HDD), according to one embodiment.

FIG. 1 is a schematic view of an exemplary hybrid disk drive (HDD) 100, according to one embodiment. For clarity, hybrid HDD 100 is illustrated without a top cover. Hybrid HDD 100 includes at least one storage disk 110 that is rotated by a spindle motor 114 and includes a plurality of concentric data storage tracks. Spindle motor 114 is mounted on a base 116. An actuator arm assembly 120 is also mounted on base 116, and has a slider 121 mounted on a flexure arm 122 with a read/write head 127 that reads data from and writes data to the data storage tracks. Flexure arm 122 is attached to an actuator arm 124 that rotates about a bearing assembly 126. Voice coil motor 128 moves slider 121 relative to storage disk 110, thereby positioning read/write head 127 over the desired concentric data storage track disposed on the surface 112 of storage disk 110. Spindle motor 114, read/write head 127, and voice coil motor 128 are controlled by electronic circuits 130, which are mounted on a printed circuit board 132. Electronic circuits 130 include a read/write channel 137, a microprocessor-based controller 133, random-access memory (RAM) 134 (which may be a dynamic RAM and is used as a data buffer), and a flash memory device 135 and flash manager device 136. In some embodiments, read/write channel 137 and microprocessor-based controller 133 are included in a single chip, such as a system-on-chip 131. In some embodiments, hybrid HDD 100 may further include a motor-driver chip 125, which accepts commands from microprocessor-based controller 133 and drives both spindle motor 114 and voice coil motor 128.

For clarity, hybrid HDD 100 is illustrated with a single storage disk 110 and a single actuator arm assembly 120. Hybrid HDD 100 may also include multiple storage disks and multiple actuator arm assemblies. In addition, each side of storage disk 110 may have an associated read/write head, similar to read/write head 127, coupled to a flexure arm, similar to flexure arm 122.

When data are transferred to or from storage disk 110, actuator arm assembly 120 sweeps an arc between an inner diameter (ID) and an outer diameter (OD) of storage disk 110. Actuator arm assembly 120 accelerates in one angular direction when current is passed in one direction through the voice coil of voice coil motor 128 and accelerates in an opposite direction when the current is reversed, thereby allowing control of the position of actuator arm assembly 120 and attached read/write head 127 with respect to storage disk 110. Voice coil motor 128 is coupled with a servo system known in the art that uses the positioning data read from servo wedges on storage disk 110 by read/write head 127 to determine the position of read/write head 127 over a specific data storage track. The servo system determines an appropriate current to drive through the voice coil of voice coil motor 128, and drives said current using a current driver and associated circuitry.

Hybrid HDD 100 is configured as a hybrid HDD, in which nonvolatile data storage may be performed using storage disk 110 and/or flash memory device 135. In a hybrid HDD, nonvolatile memory, such as flash memory device 135, supplements the spinning storage disk 110 to provide faster boot, hibernate, resume and other data read-write operations, as well as lower power consumption. Such a hybrid HDD configuration is particularly advantageous for battery operated computer systems, such as mobile computers or other mobile computing devices. In a preferred embodiment, flash memory device 135 is a nonvolatile storage medium, such as a NAND flash chip, that can be electrically erased and reprogrammed, and is sized to supplement storage disk 110 in hybrid HDD 100 as a nonvolatile storage medium. For example, in some embodiments, flash memory device 135 has data storage capacity that is orders of magnitude larger than RAM 134, e.g., gigabytes (GB) vs. megabytes (MB).

Figure 2:
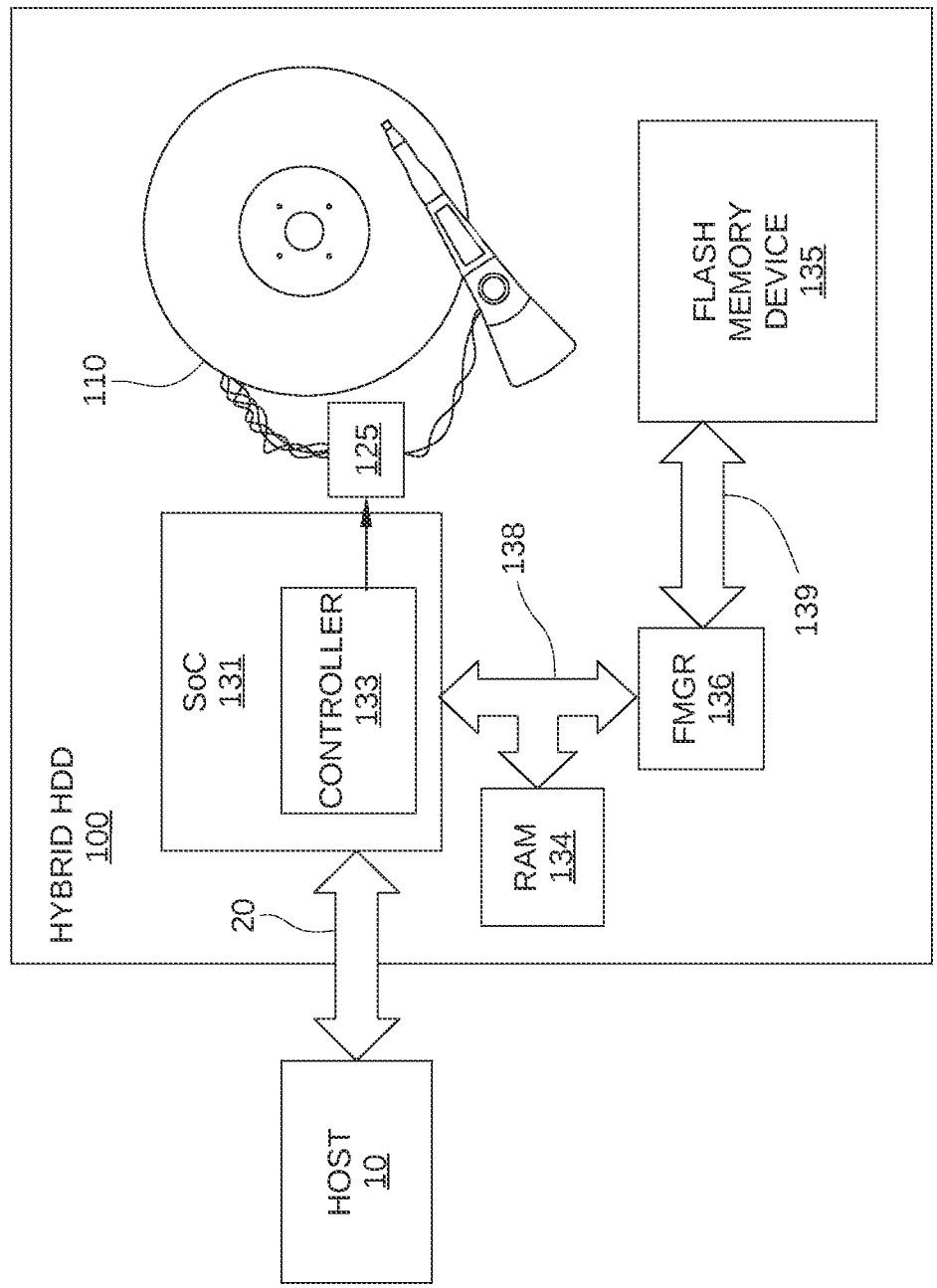
FIG. 2 illustrates an operational diagram of the hybrid HDD of FIG. 1 with elements of electronic circuits shown configured according to one embodiment.

FIG. 2 illustrates an operational diagram of hybrid HDD 100 with elements of electronic circuits 130 shown configured according to one embodiment. As shown, hybrid HDD 100 includes RAM 134, flash memory device 135, a flash manager device 136, system-on-chip 131, and a high-speed data path 138. Hybrid HDD 100 is connected to a host 10, such as a host computer, via a host interface 20, such as a serial advanced technology attachment (SATA) or serial attached SCSI (SAS) bus.

In the embodiment illustrated in FIG. 2, flash manager device 136 controls interfacing of flash memory device 135 with high-speed data path 138 and is connected to flash memory device 135 via a NAND interface bus 139. System-on-chip 131 includes microprocessor-based controller 133 and other hardware (including read/write channel 137) for controlling operation of hybrid HDD 100, and is connected to RAM 134 and flash manager device 136 via high-speed data path 138. Microprocessor-based controller 133 is a control unit that may include one or more microcontrollers such as ARM microprocessors, a hybrid HDD controller, and any control circuitry within hybrid HDD 100. High-speed data path 138 is a high-speed bus known in the art, such as a double data rate (DDR) bus, a DDR2 bus, a DDR3 bus, or the like. In other embodiments, hybrid HDD 100 may be configured with different data interfaces and buses than illustrated in FIG. 2. In particular, the controller 133 may communicate with the RAM 134 and the flash manager device 136 via separate high-speed data paths.

Figure 3:
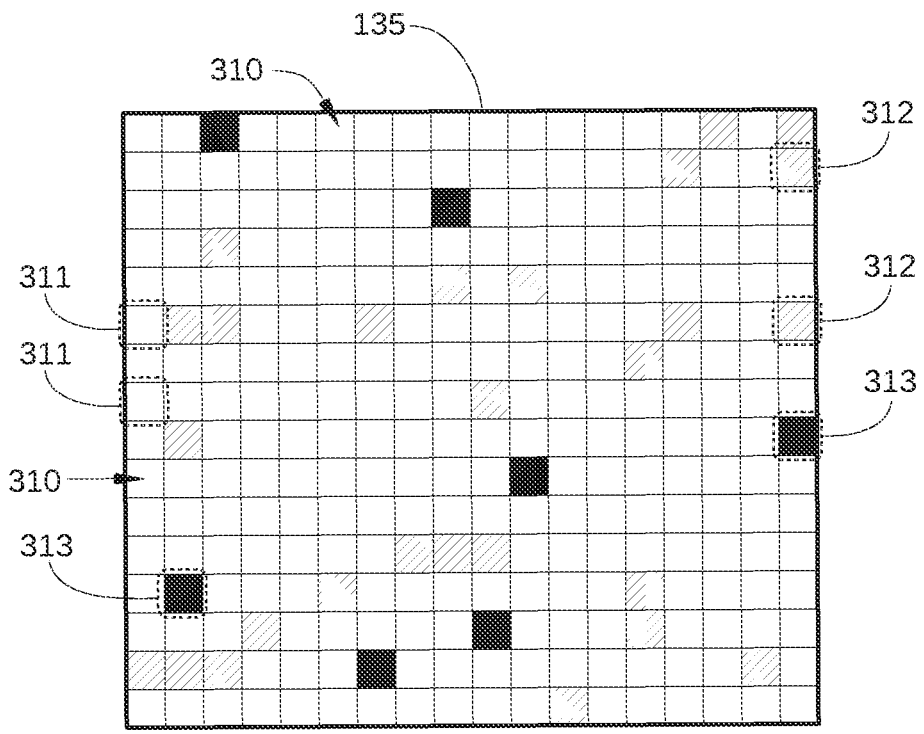
FIG. 3 is a schematic diagram of a flash memory device in the hybrid HDD of FIG. 1, according to one embodiment.

FIG. 3 is a schematic diagram of flash memory device 135, according to one embodiment. Flash memory device 135, when configured as a NAND flash device, includes a plurality of memory blocks 310 that can be individually written to, read from, and erased. In practice, flash memory device 135 includes many more memory blocks 310 than shown in FIG. 3, for example on the order of hundreds or thousands. Each of memory blocks 310 is a storage region of flash memory device 135 and typically includes a plurality of memory pages (not shown), for example 128 or 256 memory pages that are each capable of storing on the order of 32 kilobytes (KB), or 32768 bytes of data. Each page of a memory block 310 can be independently written to (or "programmed") and read from, but is generally only erasable in a blockwise fashion, i.e., when the entire memory block 310 that includes the page is erased.

A well-known limitation of NAND flash devices is memory wear and the effect thereof on the reliability of such devices. Specifically, a particular NAND flash cell can only withstand a finite number of program-erase cycles (P/E cycles) before the wear associated with repeated use significantly reduces the reliability of the NAND flash cell. For example, as the P/E cycle count for a NAND flash cell increases, data retention for that cell, i.e., how long written data remains valid within the cell, decreases. Eventually, after a NAND flash cell has undergone more than a recommended number of P/E cycles, the expected data retention of the cell can be reduced to less than or year or even a few months. NAND flash cells that have undergone this level of wear are not suitable for storing the only copy of a set of data stored by the drive, since these NAND flash cells may not reliably retain the set of data over an extended period of time or at an elevated temperature. Many commercially available NAND flash cells are guaranteed to withstand on the order of 100,000 P/E cycles or more, but this number is much less for higher density NAND flash devices and multi-level cell (MLC) flash devices. Consequently, in a hybrid HDD that includes MLC flash blocks or higher density NAND flash blocks, the recommended P/E cycle count for some or all of such blocks may be exceeded during the lifetime of the hybrid HDD.

In light of the above, according to some embodiments, each of memory blocks 310 in flash memory device 135 may be in one of three different states: nominal, marginal, and unacceptable. Thus, flash memory device 135 is depicted in FIG. 3 with nominal memory blocks 311 (white), marginal memory blocks 312 (cross-hatched), and unacceptable memory blocks 313 (black). With continued use, the number of marginal memory blocks 312 and unacceptable memory blocks 313 increases and the number of nominal memory blocks 311 decreases.

Nominal memory blocks 311 include the fully functional memory blocks 310 in flash memory device 135, and are typically guaranteed to meet a specified performance, such as reliable data retention for a particular time duration when elevated to a particular temperature. Thus, "dirty" data, i.e., data that have been received from host 10 by hybrid HDD 100, but have not been written to storage disk 110, can only be stored in nominal memory blocks 311, even after a flush-cache command is received from host 10. This is because nominal memory blocks 311 can reliably store dirty data for an extended period, even when hybrid HDD is elevated to a higher than normal temperature. One example of dirty data is data received from a host as part of a write command. When flash memory device 135 is first manufactured, the vast majority of memory blocks 310 are nominal memory blocks 311, since flash memory device 135 has undergone very little or no memory wear.

Marginal memory blocks 312 include memory blocks 310 in flash memory device 135 that are considered to be less reliable than nominal memory blocks 311. In some embodiments, marginal memory blocks 312 include memory blocks 310 of flash memory device 135 for which a P/E cycle count has exceeded a threshold number of P/E cycles. Thus, marginal memory blocks 312 are assumed to be too unreliable to meet whatever data retention specification is associated with flash memory device 135. However, marginal memory blocks 312 can still be used to store non-dirty data, since such data are also stored on storage disk 110 of hybrid HDD 100. For example, marginal memory blocks 312 may be used to store read-cache data, which are data that have been recently read from storage disk 110 in response to a read command from host 10, or write data from the host that has subsequently been written to the disk (so that it is no longer considered to be "dirty" data). By including marginal memory blocks 312 in the storage space dedicated for use as a read cache for hybrid HDD 100, the performance of hybrid HDD 100 is maintained; the read cache is not significantly reduced in size as some of memory blocks 310 lose reliability, and the frequency of more time-consuming disk accesses in response to read commands from host 10 does not increase. Thus, even as memory blocks 310 become less reliable through memory wear and other factors, the portion of flash memory 135 reserved as a read cache can remain substantially the same for a greater portion of the operating lifetime of hybrid HDD 100.

In some embodiments, marginal memory blocks 312 may also include memory blocks 310 that are considered unreliable for any other reason. For example, marginal memory blocks 312 may include memory blocks 310 that have experienced at least a threshold allowable number of read or write errors, e.g., 1, 2, 5, etc. In such embodiments, microprocessor-based controller 133 may track the number of read and/or write errors associated with each memory block 310 in flash memory device 135. When the number of such errors associated with a particular memory block 310 exceeds the threshold allowable number of read or write errors, microprocessor-based controller 133 flags that particular memory block 310 as a marginal memory block 312.

Unacceptable memory blocks 313 include memory blocks 310 that are considered to be unsuitable by flash memory device 135 for data storage. For example, in some embodiments, unacceptable memory blocks 313 include memory blocks 310 of flash memory device 135 that have exceeded a maximum number of P/E cycles. In such embodiments, this maximum number of P/E cycles is larger than the threshold number of P/E cycles used to determine that a memory block 310 should be flagged as a marginal memory block 312. Thus, memory blocks 310 that have exceeded the above described maximum number of P/E cycles have undergone significantly more wear than marginal memory blocks, and are therefore even less reliable.

Unacceptable memory blocks 313 may also include memory blocks 310 that have been designated bad blocks during operation of hybrid HDD 100. For example, due to block-to-block manufacturing variation in memory blocks 310, a small portion of memory blocks 310 generally fails much sooner than the majority of memory blocks 310, i.e., before undergoing a typical number of P/E cycles. Upon failure, such memory blocks are flagged as bad blocks with a bad block marker or are otherwise indicated to be unacceptable memory blocks 313. Alternatively or additionally, unacceptable memory blocks 313 may include memory blocks 310 that have experienced a maximum allowable number of read or write errors. Generally, the maximum allowable number of read or write errors is greater than the threshold number of read or write errors (described above) used to determine that a memory block 310 should be flagged as a marginal memory block 312.

The status of each memory block 310, i.e., whether a particular memory block 310 is a nominal memory block 311, a marginal memory block 312, or an unacceptable memory block 313, may be tracked by microprocessor-based controller 133 via metadata associated with each block or any other suitable data structure. For example, unacceptable memory blocks 313 may be flagged with a bad block marker, such as that already commonly in use in conventional flash memory devices. Similarly, each marginal memory block 312 may be flagged with an additional bit, marker, or other indicator in firmware associated with microprocessor-based controller 133. Alternatively or additionally, to facilitate selection of marginal memory blocks 312 during operation, an address or other identifier for each marginal memory block 312 may be stored in a dedicated table. Because each memory block 310 may be a relatively large block of storage, the amount of additional metadata associated with tracking each marginal memory block 312 in flash memory device 135 is not cumbersome. For example, for memory blocks 310 sized to store 8 megabytes (MBs) of data each, only a 125 addresses need to be stored per gigabyte of storage capacity for flash memory device 135. Such metadata may be stored in flash memory device 135, a separate nonvolatile solid-state device included in electronic circuits 130 of hybrid HDD 100, or any other technically feasible nonvolatile location in hybrid HDD 100 accessible by microprocessor-based controller 133.

According to some embodiments, hybrid HDD 100 stores data in flash memory device 135 according to multiple modes of operation, including a full caching mode, a transitional caching mode, and a hard disk drive only mode (i.e., NAND-less mode). These modes of operation may be selected based on the current state of individual storage regions of flash memory device 135. For example, when at least some of memory blocks 310 are marginal memory blocks 312, hybrid HDD 100 may operate in the transitional caching mode, and when most or all of memory blocks are unacceptable memory blocks 313, hybrid HDD 100 may operate in the hard disk drive only mode. Alternatively, these modes of operation may be selected based on a total P/E cycle count or measured performance of the nonvolatile solid-state device taken as a whole.

In full caching mode, hybrid HDD 100 employs flash memory device 135 as both a nonvolatile read cache and a nonvolatile write cache, thereby significantly improving the performance of hybrid HDD 100. Using flash memory device 135 as a large, nonvolatile read cache reduces time-consuming accesses to storage disk 110, while using flash memory device 135 as a large, nonvolatile write cache allows write commands to be completed much more quickly by hybrid HDD 100. For example, when receiving a large number of relatively short write commands directed to random locations on storage disk 110, such write commands may be written to the write cache of flash memory device 135 hundreds of times faster than to storage disk 110. In full caching mode, hybrid HDD 100 uses nominal memory blocks 311 for the read cache and for the write cache.

In some embodiments, one or more marginal memory blocks 312 may be available for use in flash memory device 135, but hybrid drive 100 continues to operate in full caching mode. For example, when fewer marginal memory blocks 312 are available than a predetermined threshold value (e.g., 1% of the total number of memory blocks 310) for switching to transitional caching mode, hybrid HDD 100 may remain in full caching mode. Hybrid HDD 100 generally operates in full caching mode when there are no marginal memory blocks 312 currently present in flash memory device 135 or fewer marginal memory blocks 312 than the above-described predetermined threshold value. Thus, full caching mode is generally employed when flash memory device 135 has not experienced significant memory wear.

In transitional caching mode, hybrid HDD 100 employs flash memory device 135 as a nonvolatile read cache and, in some embodiments, a nonvolatile write cache, thereby significantly reducing or eliminating reductions in performance of hybrid HDD 100 as flash memory device 135 suffers memory wear. Unlike full caching mode, in transitional caching mode hybrid HDD 100 uses some or all available marginal memory blocks 312 in flash memory device 135. However, because of the reduced reliability of marginal memory blocks 312, these memory blocks are used for storing read cache data and not for storing dirty data, such as write cache data. As marginal memory blocks 312 in flash memory device 135 become available, these memory blocks are used to maintain a suitably sized read cache for hybrid HDD 100, while nominal memory blocks 311 continue to be used to maintain a suitably sized write cache for hybrid HDD 100. Thus, the performance of flash memory device 135 is not significantly reduced until there are insufficient nominal memory blocks 311 available to maintain the suitably sized write cache for hybrid HDD 100. As more nominal memory blocks 311 undergo sufficient wear to become marginal memory blocks 312, the size of the write cache in flash memory device 135 decreases, and accesses to storage disk 110 become more frequent in the completion of write commands, or in the completion of Flush-Cache commands after write commands. With continued use, flash memory device 135 will have no or very few remaining nominal memory blocks 311, at which point flash memory device 135 is no longer employed as a write cache for hybrid HDD 100.

In some embodiments, transitional caching mode is employed based on the current status of flash memory device 135 as a whole, rather than on the status of individual memory blocks 310. For example, in some embodiments, an average P/E cycle count may be used to determine whether hybrid HDD 100 is in full caching mode or in transitional caching mode. The average P/E cycle count may be an average P/E cycle count for all memory blocks 310 in flash memory device 135, or an average P/E cycle count for all memory blocks that are not unacceptable memory blocks 313. In such embodiments, when hybrid HDD 100 operates in transitional caching mode, most or all available memory blocks 310 in flash memory device 135, i.e., remaining nominal memory blocks 311 and marginal memory blocks 312 but not unacceptable memory blocks 313, are used to store data that are also stored on storage disk 110, such as read cache data. However, the available memory blocks 310 are not used to store dirty data, such as write cache data, since flash memory device 135, as a whole, is considered to be too unreliable to store dirty data for an extended period of time. Thus, in such embodiments, microprocessor-based controller 133 may not track the status of individual marginal memory blocks 312, since memory blocks 310 that are not designated as unacceptable memory blocks 313 (i.e., nominal memory blocks 311 and marginal memory blocks 312) are employed in the same way in transitional caching mode. Instead, hybrid drive 100 may only track whether individual memory blocks 310 are unacceptable blocks 313.

In hard disk drive only mode, hybrid HDD 100 operates essentially as a conventional hard disk drive and does not employs flash memory device 135 as a nonvolatile read cache or as a nonvolatile write cache. Consequently, when hybrid HDD 100 operates in hard disk drive only mode, flash memory device 135 may be completely disabled. In some embodiments, hybrid HDD 100 begins operating in hard disk drive only mode when an average P/E cycle count for memory blocks 130 exceeds a threshold value. Thus, as the average wear on memory blocks 130 exceeds or approaches the maximum recommended number of P/E cycles for memory blocks 130, flash memory device 135 is no longer used and data are no longer stored therein.

As a memory block 310 in flash memory device 135 experiences memory wear, the likelihood of read and write errors to that memory block 130 generally increases, even though the P/E cycle count for that memory block 130 has not exceeded a maximum recommended number of P/E cycles. Furthermore, due to wear-leveling algorithms typically employed in flash memory device 135, the P/E cycle counts for most memory blocks 310 are roughly equal. Consequently, as the average P/E cycle count for memory blocks 130 approaches the maximum recommended number, read and write errors to flash memory device 130 can increase significantly, even though the P/E cycle count for very few or no memory blocks 310 has exceeded the maximum recommended number. Because recovery from such read errors can be relatively time-consuming, the use of flash memory device 135 as a read cache can potentially reduce the performance of hybrid HDD 100. Specifically, as the frequency of read and write errors to flash memory device 135 increases, the recovery time associated with read and write errors to flash memory device 135 for a particular read command becomes, on average, greater than the time potentially saved by using flash memory device 135 as a read cache.

In light of the above, in some embodiments, hybrid HDD 100 begins operating in hard disk drive only mode when a performance metric associated with flash memory device 135 exceeds a specific value. For example, the performance metric may include or be based on an average read error rate associated with reading data from the flash memory device 135 and/or on an average error correction time associated with reading data from the flash memory device 135. The specific value may be a predetermined value that is based on an estimated performance of hybrid HDD 100 when flash memory device 135 is not used as a read cache, such as an average estimated time required for a typical hybrid HDD 100 to read a quantity of data from storage disk 110 versus the time required to read that same data from flash memory device 135 (including the time required for read-recovery operations, due to read-errors suffered by flash memory device 135), or an acceptable maximum read error rate for flash memory device 135. Alternatively, the specific value may be a measured value that is based on a calculated performance of hybrid HDD 100 when flash memory device 135 is not used as a read cache. For example, one such specific value is a calculated average time that would have been required for hybrid HDD 100 to complete read commands by reading data associated with these commands from storage disk 110 rather than from flash memory device 135. In some embodiments, microprocessor-based controller 133 may be configured to calculate such a time for each read command received and maintain a running average of these calculated times. In other embodiments, microprocessor-based controller 133 may be configured to calculate such a time periodically. In either case, when the performance metric associated with flash memory device 135 exceeds the specific value, hybrid HDD 100 begins operating in hard disk drive only mode, since use of flash memory device 135 on average reduces performance of hybrid HDD 100 due to excessive read errors. That is, the performance metric indicates that reading data from storage disk 110 is faster than reading data from flash memory 135 according to the second mode of operation.

As noted above, a calculation of an average time for hybrid HDD 100 to complete read commands by reading data from storage disk 110 may be performed to determine whether hybrid HDD 100 should operate in hard disk drive only mode. For example, read/write-reordering algorithms commonly employed by conventional HDDs can readily perform such calculations. However, these calculations use computation resources and power. In some embodiments, such calculations are not performed in full caching mode, since memory blocks 130 generally have very few read errors. In such embodiments, the calculation of an average time for hybrid HDD 100 to complete read commands by reading data from storage disk 110 is only performed when hybrid HDD 100 operates in transitional mode.

Figure 4:
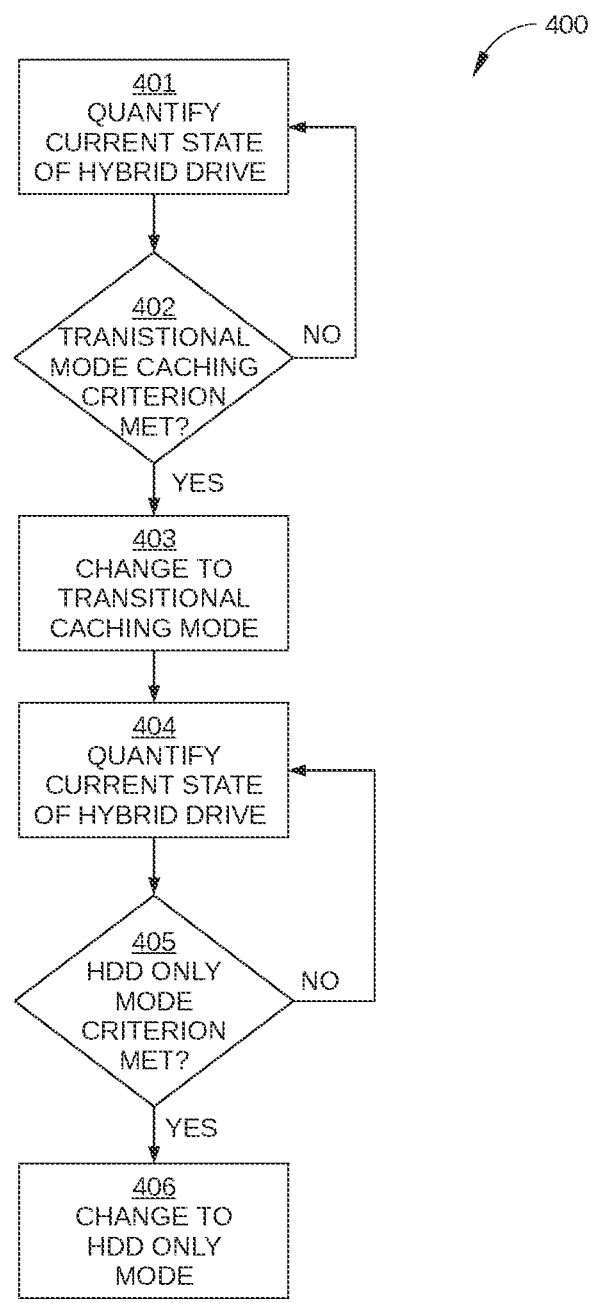
FIG. 4 sets forth a flowchart of method steps for determining a caching mode in the hybrid HDD of FIG. 1, according to one or more embodiments.

FIG. 4 sets forth a flowchart of method steps for determining a caching mode in a data storage device, such as hybrid HDD 100, according to one or more embodiments. Although the method steps are described in conjunction with hybrid HDD 100 in FIGS. 1-3, persons skilled in the art will understand that method 400 may be performed with other hybrid drives. The control algorithms for method 400 may reside in and/or be performed by controller 133, flash manager device 136, and/or any other suitable control circuit or system. Generally, hybrid HDD 100 begins method 400 in full caching mode.

As shown, method 400 begins at step 401, where controller 133 or other suitable control circuit or system quantifies a current state of flash memory device 135. In some embodiments, the current state is based on the current status of individual storage regions of flash memory device 135, such as the total number of memory blocks 310 that are marginal memory blocks 312. In other embodiments, the current state is based on a total P/E cycle count for flash memory device 135, on an average P/E cycle count for memory blocks 310, or any other suitable metric of the overall performance of flash memory device 135.

In step 402, controller 133 determines whether a criterion for operating in transitional mode has been met. The current state measured in step 401 is compared to this criterion and method 400 proceeds to step 403 when the criterion is met. Method 400 returns to step 401 if the criterion is not met and hybrid HDD 100 continues to operate in full caching mode. In some embodiments, the criterion is a threshold value of marginal memory blocks 312 present in flash memory device 135. Thus, when the total number of marginal memory blocks 312 exceeds the threshold value, method 400 proceeds to step 403. Alternatively, the criterion may be a threshold value of total P/E cycles for flash memory device 135, an average P/E cycle count for memory blocks 310, or any other suitable metric of the overall performance of flash memory device 135.

In step 403, hybrid HDD 100 begins operating in transitional caching mode. In some embodiments, memory blocks 310 (excluding unacceptable memory blocks 313) are employed as a read cache, whereas in other embodiments, some or all of nominal memory blocks 311 are used as a write cache for hybrid HDD 100 and some or all of marginal memory blocks 312 are used as a read cache for hybrid HDD 100.

In step 404, controller 133 quantifies a current state of flash memory device 135. In some embodiments, the current state is based on the current status of individual storage regions of flash memory device 135, such as the total number of memory blocks 310 that are unacceptable memory blocks 313. In other embodiments, the current state is based on a total P/E cycle count for flash memory device 135 or on an average P/E cycle count for memory blocks 310. In yet other embodiments, controller 133 quantifies the current state of flash memory device 135 by tracking a performance metric associated with flash memory device 135. The performance metric may include an average read error rate associated with reading data from the flash memory device 135, an average error correction time associated with reading data from the flash memory device 135, and/or an actual time required to complete one or more specific read commands when the data associated with the read commands are read from flash memory device 135. The performance metric or metrics may be tracked continuously, at periodic intervals, and/or in response to a particular event during operation of hybrid HDD 100, such as an overheating event, an unexpected power off event, a specified time of use, and the like.

In step 405, controller 133 determines whether a criterion for operating in HDD only mode has been met. The current state measured in step 404 is compared to this criterion and method 400 proceeds to step 406 when the criterion is met. Method 400 returns to step 404 if the criterion is not met and hybrid HDD 100 continues to operate in transitional caching mode. In some embodiments, the criterion is a threshold value of unacceptable memory blocks 313 present in flash memory device 135. Thus, when the total number of unacceptable memory blocks 313 exceeds the threshold value, method 400 proceeds to step 406. Alternatively, the criterion may be a threshold value of total P/E cycles for flash memory device 135 or an average P/E cycle count for memory blocks 310. Alternatively or additionally, the criterion may include an average estimated time required for a typical hybrid HDD 100 to read a quantity of data from storage disk 110, an acceptable maximum read error rate for the flash memory device 135, and/or a calculated time required to complete the one or more specific read commands referenced in step 404 when the data associated with the read commands is read from storage disk 110.

In step 406, hybrid HDD 100 begins operating in HDD only caching mode, in which hybrid HDD 100 typically disables flash memory device 135.

FIGS. 5, 6, 7A and 7B set forth a flowchart of method steps for accessing (i.e., reading from or writing to) a data storage device, such as hybrid HDD 100, according to one or more embodiments. Although the method steps are described with respect to hybrid HDD 100 in FIGS. 1-4, persons skilled in the art will understand that the method steps may be performed with other hybrid drives. The control algorithms for the method steps may reside in and/or be performed by controller 133, flash manager device 136, and/or any other suitable control circuit or system. As described below, the method steps may vary depending on the current caching mode of hybrid HDD 100.

Figure 5:
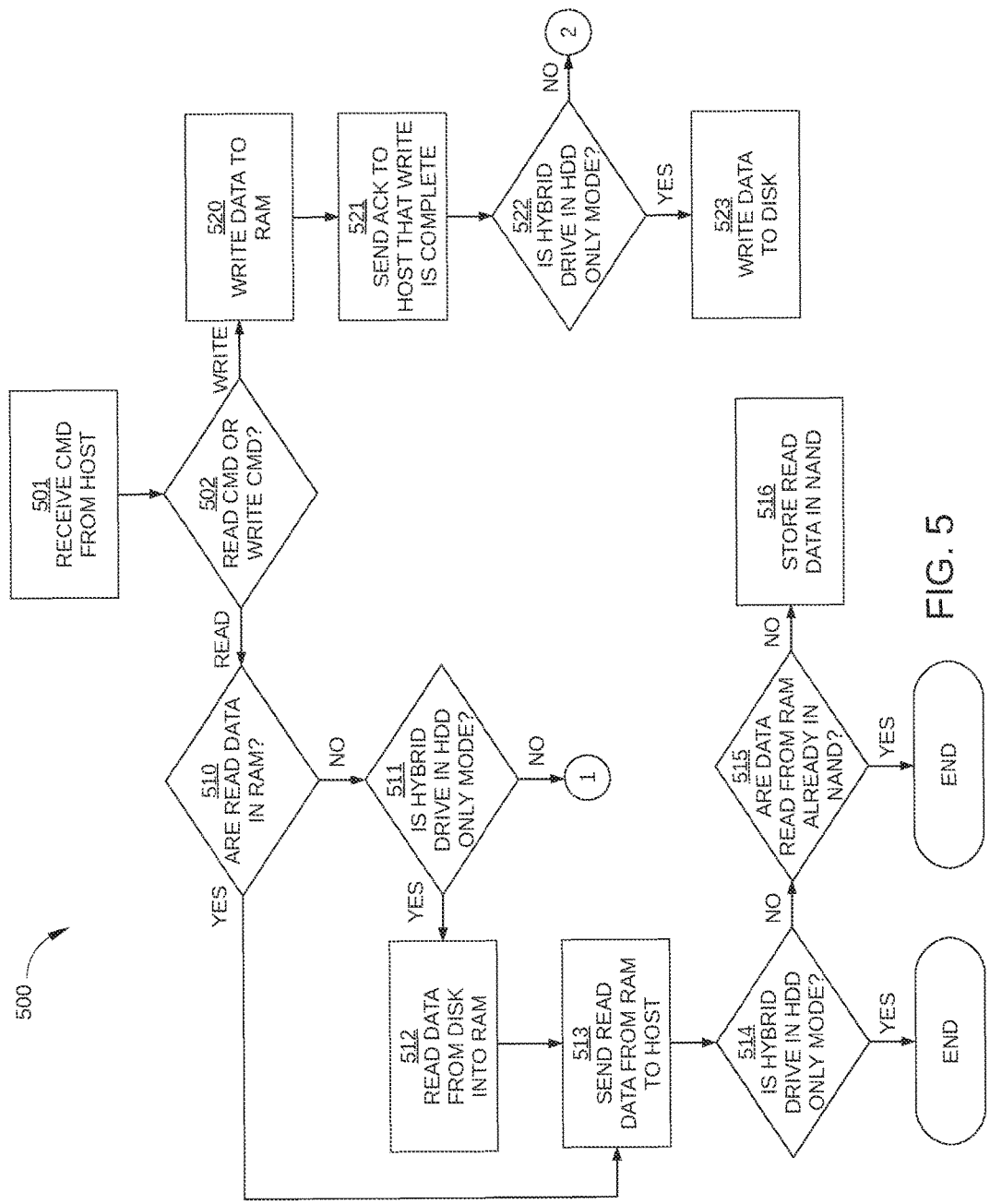
FIGS. 5, 6, 7A, and 7B set forth a flowchart of method steps for accessing the hybrid HDD of FIG. 1, according to one or more embodiments.

As shown in FIG. 5, a method 500 begins at step 501, where microprocessor-based controller 133 receives a command from host 10. The command may be a read command that references a sequential group of logical block addresses (LBAs), indicating that host 10 requests the data associated with these LBAs. Alternatively, the command may be a write command that references a sequential group of LBAs and data associated with these LBAs, indicating that host 10 requests that the data associated with these LBAs be stored in hybrid HDD 100. In step 502, microprocessor-based controller 133 determines whether the command received in step 501 is a read command or a write command. If the former, method 500 proceeds to step 510, and if the latter, method 500 proceeds to step 520.

In step 510, microprocessor-based controller 133 determines whether the read data associated with the LBAs indicated in the read command are stored in RAM 134. If the data are stored in RAM 134, method 500 proceeds to step 513. If the data are not stored in RAM 134, method 500 proceeds to step 511. In step 511, microprocessor-based controller 133 determines whether hybrid HDD 100 is in HDD only mode. If yes, method 500 proceeds to step 512, if no, method 500 proceeds to step 601 in FIG. 6. In step 512, microprocessor-based controller 133 reads the requested data from storage disk 110 into RAM 134, and in step 513, microprocessor-based controller 133 sends the requested read data to host 10.

In step 514, microprocessor-based controller 133 determines whether hybrid HDD 100 is in HDD only mode. If no, method 500 proceeds to step 515; if yes, method 500 ends. In step 515, microprocessor-based controller 133 determines whether the data read from NAND are already in flash memory device 135. If no, method 500 proceeds to step 516; if yes, method 500 ends. In step 516, microprocessor-based controller 133 stores the data read from storage disk 110 in flash memory device 135, thereby updating the read cache stored therein. In some embodiments, only a portion of the read data are stored in flash memory device 135 in step 516 to update the read cache, depending on the caching policy of hybrid HDD 100. For example, only data associated with the initial portion of longer read commands or sequential read streams may be stored in the read cache, such as the first 1 or 2 MBs of data associated with the read command received in step 501.

In step 520, microprocessor-based controller 133 writes the data associated with the write command to RAM 134. In step 521, microprocessor-based controller 133 sends an acknowledgment message to host 10 to indicate that the write command has been received and is nominally complete (although not yet stored in a nonvolatile storage medium). In step 522, microprocessor-based controller 133 determines whether hybrid HDD 100 is in HDD only mode. If hybrid HDD 100 is not in HDD only mode, method 500 proceeds to step 701 in FIG. 7A or step 710 in FIG. 7B, depending on which embodiment of transitional caching mode microprocessor-based controller 133 is configured to implement. When microprocessor-based controller 133 is configured to use flash memory device 135 as a read cache but not as a write cache while in transitional caching mode, method 500 proceeds to step 701 in FIG. 7A. When microprocessor-based controller 133 is configured to use available nominal blocks 311 in flash memory device 135 as a write cache while in transitional caching mode, method 500 proceeds to step 710 in FIG. 7B. If hybrid HDD 100 is in HDD only mode, method 500 proceeds to step 523. In step 523, microprocessor-based controller 133 writes the data associated with the write command to storage disk 110 at the LBAs referenced in the write command.

Figure 6:
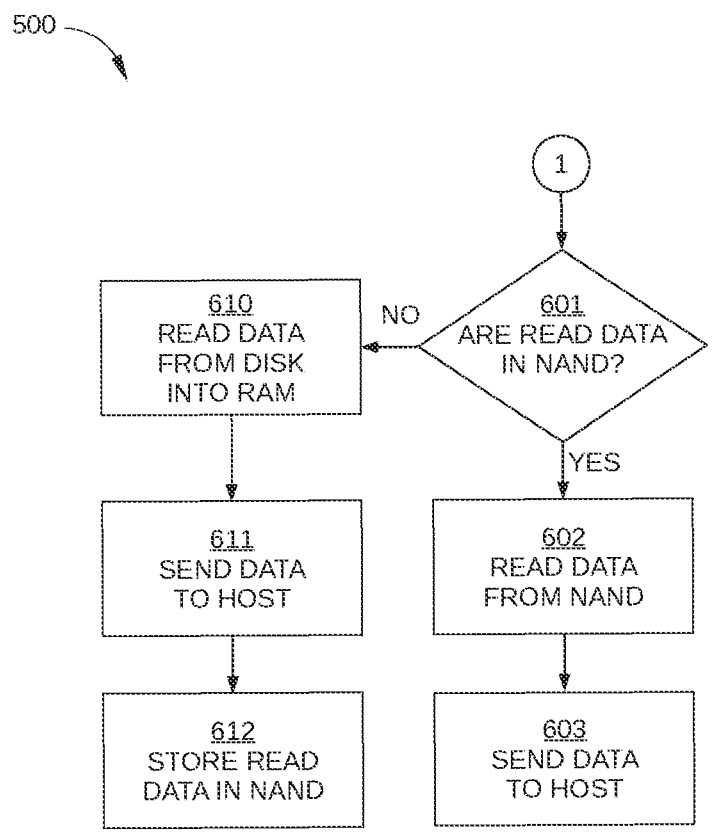

In step 601, shown in FIG. 6, microprocessor-based controller 133 determines whether the data requested by host 10 in step 501 is currently stored in flash memory device 135 (NAND). If yes, method 500 proceeds to step 602; if no, method 500 proceeds to step 610. In step 602, microprocessor-based controller 133 reads the requested data from flash memory device 135 into RAM 134. In step 603, microprocessor-based controller 133 sends the requested data to host 10.

In step 610, performed when the data requested by host 10 are not currently stored in flash memory device 135, microprocessor-based controller 133 reads the requested data from storage disk 110 (at the LBAs referenced in the read command) and into RAM 134. In step 611, microprocessor-based controller 133 sends the requested data to host 10. In step 612, microprocessor-based controller 133 stores the data read from storage disk 110 in flash memory device 135, thereby updating the read cache of hybrid HDD 100. In step 612, the data may be stored in nominal memory blocks 311, marginal blocks 312 (since these data are also stored on storage disk 110) or a combination of both. As described above in conjunction with step 516, in some embodiments, only an initial portion of the data read from storage disk 110 are saved in flash memory device 135. It is noted that steps 601, 602, 603, 610, 611, and 612 may be performed when hybrid HDD 100 is in either transitional caching mode or full caching mode, since in either case flash memory device 135 is used as a read cache for hybrid HDD 100. Alternatively, microprocessor-based controller 133 may perform step 612 prior to step 611, but in such embodiments, performance of hybrid HDD 100 may be reduced, since the read command is not completed by hybrid HDD 100 until the read data are sent to host 10.

Figure 7A:
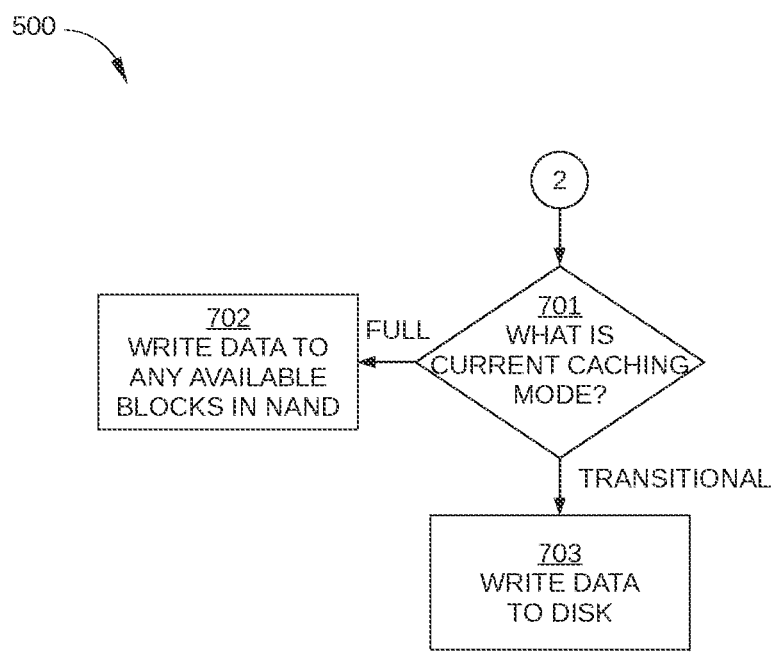

In step 701, shown in FIG. 7A, microprocessor-based controller 133 determines the current mode of operation of hybrid HDD 100. If hybrid HDD 100 is in transitional caching mode, method 500 proceeds to step 703. If hybrid HDD 100 is in full caching mode, method 500 proceeds to step 702. In step 702, microprocessor-based controller 133 writes the data associated with the write command received from host 10 to available nominal memory blocks 311 in flash memory device 135, thereby updating the write cache of hybrid HDD 100. This is because in full caching mode hybrid HDD 100 employs portions of flash memory device 135 as a write cache. In some embodiments, only data associated with a portion of the write command, e.g., the first few MBs of a large write command or a long sequential-write stream, are stored in flash memory device in step 702, so that the write cache is not filled by a relatively small number of large write commands or long write streams. Exactly how much data and which portion of the write command depends on the caching policy of hybrid HDD 100. In step 703, microprocessor-based controller 133 writes the data associated with the write command to storage disk 110. It is noted that steps 701-703 are performed when microprocessor-based controller 133 is configured to use flash memory device 135 as a read cache but not as a write cache while in transitional caching mode. By contrast, steps 710-714 (described below) are performed when microprocessor-based controller 133 is configured to use flash memory device 135 as a read cache and available nominal memory blocks 311 as a write cache while in transitional caching mode.

Figure 7B:
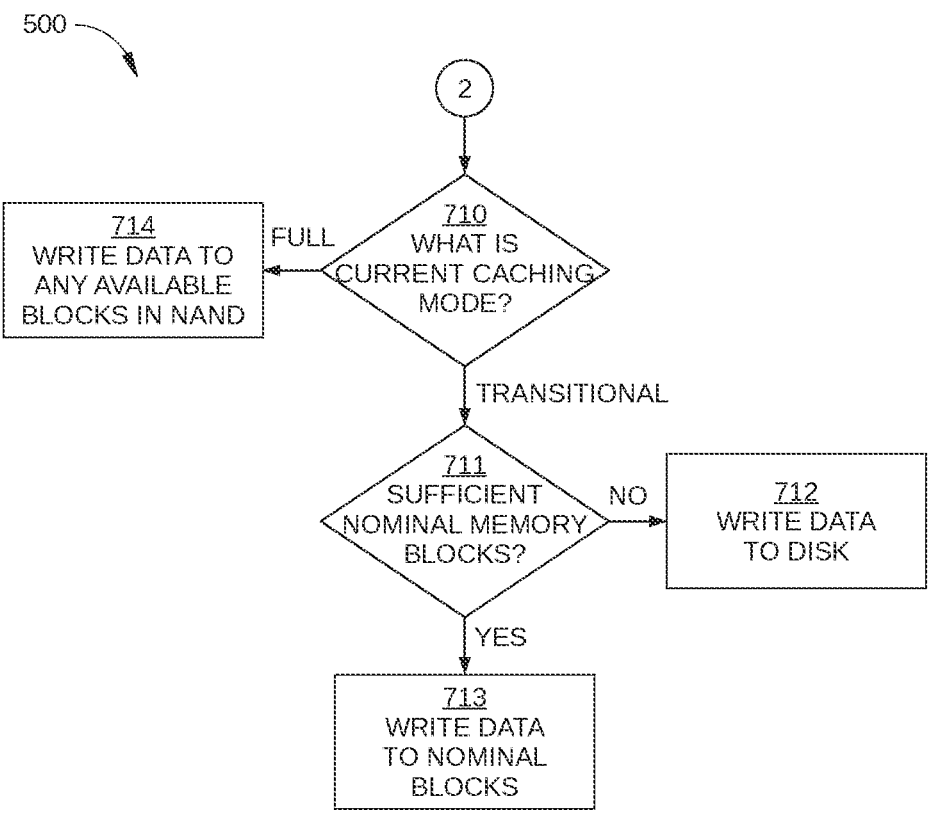

In step 710, shown in FIG. 7B, microprocessor-based controller 133 determines the current mode of operation of hybrid HDD 100. If hybrid HDD 100 is in transitional caching mode, method 500 proceeds to step 711. If hybrid HDD 100 is in full caching mode, method 500 proceeds to step 714. In step 711, microprocessor-based controller 133 determines whether there are sufficient nominal memory blocks 311 to store the data associated with the read command received in step 501. If there are insufficient nominal memory blocks 311 available in flash memory device 135, method 500 proceeds to step 712. If there are sufficient nominal memory blocks 311 available in flash memory device 135, method 500 proceeds to step 713. In step 712, microprocessor-based controller 133 stores the data on storage disk 110, since there are insufficient memory blocks 310 capable of reliably storing the data associated with the write command. In step 713, the data are stored in available nominal memory blocks 311 in flash memory device 135.

In step 714, which is performed in response to the determination in step 710 that hybrid HDD 100 is in full caching mode, the data associated with the write command are stored in available nominal memory blocks 311 in flash memory device 135. Because hybrid HDD 1000 is in full caching mode, most or all of memory blocks 310 are nominal memory blocks 311, and are capable of reliably storing the write data written thereto.

In sum, embodiments described herein provide systems and methods for storing data in a hybrid HDD via multiple modes of operation: a full caching mode, a transitional caching mode, and an HDD only mode. The mode of operation may be selected based on the current condition or performance of individual storage regions in a nonvolatile solid-state device of the hybrid HDD, or on the current condition or performance of the nonvolatile solid-state device as a whole. As the nonvolatile solid-state device undergoes wear, performance of the hybrid HDD is maintained by using less reliable memory blocks in the nonvolatile solid-state device as a read cache, even when these memory blocks are considered too unreliable to store dirty data.

While the foregoing is directed to embodiments of the present invention, other and further embodiments of the invention may be devised without departing from the basic scope thereof, and the scope thereof is determined by the claims that follow.

We claim:

1. A data storage device comprising:
a nonvolatile solid-state storage device;
a magnetic storage device; and
a controller configured to determine whether data associated with a command from a host is to be stored in the data storage device according to one of a first mode of operation, a second mode of operation, and a third mode of operation, wherein the controller, after having determined that the data associated with the command is to be stored in the first mode of operation, stores the data associated with the command in a particular region of the nonvolatile solid-state storage device when a read command is received from the host, and stores the data associated with the command in the particular region when a write command is received from the host, wherein the controller, after having determined that the data associated with the command is to be stored in the second mode of operation, (i) stores the data associated with the command in the particular region when the read command is received from the host, (ii) stores the data associated with the command in the particular region when the write command is received from the host and the data associated with the command are stored in the magnetic storage device, and (iii) does not store the data associated with the command received from the host in the particular region when the write command is received from the host and the data associated with the command are not stored in the magnetic storage device, and wherein the controller, after having determined that the data associated with the command is to be stored in the third mode of operation, does not store the data associated with the command received from the host in the particular region.

2. The data storage device of claim 1, wherein the controller determines that the data associated with the command is to be stored according to the second mode of operation after a program/erase cycle count of the particular region exceeds a first threshold value.

3. The data storage device of claim 2, wherein the controller determines that the data is to be stored according to the third mode of operation after a program/erase cycle count of the particular region exceeds a second threshold value, the second threshold value being greater than the first threshold value.

4. The data storage device of claim 2, wherein the controller determines that the data is to be stored according to the third mode of operation when a program/erase cycle count of the particular region exceeds the first threshold value.

5. The data storage device of claim 1, wherein the controller determines that the data is to be stored according to the second mode of operation when an average program/erase cycle count of a plurality of regions of the nonvolatile solid-state storage device exceeds a first threshold value.

6. The data storage device of claim 5, wherein the controller is configured to:
track a performance metric of the nonvolatile solid-state storage device when storing data received from the host in the plurality of regions according to the second mode of operation; and
determine that the data associated with the command is to be stored according to the third mode of operation when the performance metric indicates that reading data associated with a read command from the magnetic storage device is faster than reading the data associated with the read command from the particular region.

7. The data storage device of claim 6, wherein the performance metric is based on at least one of an average read error rate associated with reading data from the particular region and an average error correction time.

8. A method of storing data in data storage device that includes a nonvolatile solid-state device and a magnetic storage medium, the method comprising:
  determining whether data associated with a command from a host is to be stored in the data storage device according to one of a first mode of operation, a second mode of operation, or a third mode of operation;
  after the data associated with the command is determined to be stored in the first mode of operation, storing data associated with the command from the host in a particular region of the nonvolatile solid-state storage device when a read command is received from the host, and storing the data associated with the command in the particular region when a write command is received from the host;
  after the data associated with the command from the host is determined to be stored in the second mode of operation, (i) storing the data associated with the command in the particular region when the read command is received from the host, (ii) storing the data associated with the command in the particular region when the write command is received from the host and the data associated with the command are stored in the magnetic storage device, and (iii) storing no data associated with the command received from the host in the particular region when the write command is received from the host and the data associated with the command are not stored in the magnetic storage device, and
  after the data associated with the command from the host is determined to be stored in the third mode of operation, storing no data associated with the command in the particular region.

9. The method of claim 8 further comprising determining that the data associated with the command from the host is to be stored according to the second mode of operation after a program/erase cycle count of the particular region exceeds a first threshold value.

10. The method of claim 9, further comprising determining that the data associated with the command from the host is to be stored according to the third mode of operation after a program/erase cycle count of the particular region exceeds a second threshold value, the second threshold value being greater than the first threshold value.

11. The method of claim 9, further comprising determining that the data associated with the command from the host is to be stored according to the third mode of operation when a program/erase cycle count of the particular region exceeds the first threshold value.

12. The method of claim 8, further comprising:
  tracking a performance metric of the nonvolatile solid-state storage device when storing data received from the host in the plurality of regions according to the second mode of operation; and
  determining that the data associated with the command from the host is to be stored according to the third mode of operation when the performance metric indicates that reading data associated with a read command from the magnetic storage device is faster than reading the data associated with the read command from the particular region.

13. The method of claim 12, wherein the performance metric is based on at least one of an average read error rate associated with reading data from the particular region and an average error correction time.

* * * * *